(12) United States Patent
Okumura

(10) Patent No.: US 12,017,361 B2
(45) Date of Patent: Jun. 25, 2024

(54) ROBOT STOPPING METHOD AND ROBOT SYSTEM

(71) Applicant: NIDEC SANKYO CORPORATION, Nagano (JP)

(72) Inventor: Hirokatsu Okumura, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 371 days.

(21) Appl. No.: 17/629,394

(22) PCT Filed: Jul. 13, 2020

(86) PCT No.: PCT/JP2020/027244
§ 371 (c)(1),
(2) Date: Jan. 23, 2022

(87) PCT Pub. No.: WO2021/024707
PCT Pub. Date: Feb. 11, 2021

(65) Prior Publication Data
US 2022/0250241 A1 Aug. 11, 2022

(30) Foreign Application Priority Data
Aug. 6, 2019 (JP) ................. 2019-144513

(51) Int. Cl.
*B25J 9/16* (2006.01)
*B25J 9/12* (2006.01)

(52) U.S. Cl.
CPC ............ *B25J 9/1651* (2013.01); *B25J 9/126* (2013.01); *B25J 9/1664* (2013.01); *B25J 9/1674* (2013.01); *B25J 9/1615* (2013.01)

(58) Field of Classification Search
CPC ........ B25J 9/1651; B25J 9/126; B25J 9/1664; B25J 9/1674; B25J 9/1615; B25J 18/04;
(Continued)

(56) References Cited

U.S. PATENT DOCUMENTS 6,538,227 B1 * 3/2003 Sano ................. B23H 7/30
219/69.2
6,741,057 B2 * 5/2004 Iwashita .............. G05B 19/406
318/632

(Continued)

FOREIGN PATENT DOCUMENTS

JP H10124132 A * 5/1998 ........... G05B 19/416
JP 2001339875 12/2001
(Continued)

OTHER PUBLICATIONS

JP-H10124132-A translation (Year: 1998).*
(Continued)

*Primary Examiner* — Jason Holloway
*Assistant Examiner* — Kyle T Johnson
(74) *Attorney, Agent, or Firm* — JCIPRNET

(57) ABSTRACT

In a robot stopping method, if a shaft that moves at least a part of the robot in the gravity direction is defined as a Z shaft and a time at which the occurrence of the power failure has been detected is set as a reference time, a first control is performed if the occurrence of the power failure has been detected when the Z shaft is in a state of ascent, in which based on an ascending speed of the Z shaft at the reference time, a time until a speed of the Z shaft reaches zero as a result of deceleration by a gravitational acceleration is calculated as a deceleration time, the Z shaft is driven so as to decelerate and stop ascent of the Z shaft by spending the deceleration time.

14 Claims, 6 Drawing Sheets

(58) Field of Classification Search
CPC ..... B25J 9/042; B25J 19/06; B25J 9/10; B25J 9/12; B25J 19/005; B25J 19/0066; H01L 21/677; H02P 3/00
See application file for complete search history.

(56) References Cited

U.S. PATENT DOCUMENTS

| | | | |
|---|---|---|---|
| 10,110,157 B2* | 10/2018 | Fujimoto | H02P 29/025 |
| 2003/0076066 A1* | 4/2003 | Iwashita | G05B 19/406 318/638 |
| 2013/0046409 A1* | 2/2013 | Tanaka | B25J 9/103 74/421 A |
| 2015/0054444 A1* | 2/2015 | Tajima | G05B 19/406 318/565 |
| 2022/0250241 A1* | 8/2022 | Okumura | B25J 19/06 |

FOREIGN PATENT DOCUMENTS

| | | |
|---|---|---|
| JP | 2002218676 | 8/2002 |
| JP | 2003131701 | 5/2003 |
| JP | 2004220384 | 8/2004 |
| JP | 2008204365 | 9/2008 |
| JP | 2009095939 | 5/2009 |
| JP | 2009201180 | 9/2009 |

OTHER PUBLICATIONS

"International Search Report (Form PCT/ISA/210) of PCT/JP2020/027244," mailed on Oct. 6, 2020, with English translation thereof, pp. 1-4.

* cited by examiner

ROBOT STOPPING METHOD AND ROBOT SYSTEM

CROSS-REFERENCE TO RELATED APPLICATION

This application is a 371 of international application of PCT application serial no. PCT/JP2020/027244, filed on Jul. 13, 2020, which claims the priority benefit of Japan application no. 2019-144513, filed on Aug. 6, 2019. The entirety of each of the above-mentioned patent applications is hereby incorporated by reference herein and made a part of this specification.

TECHNICAL FIELD

The present invention relates to a robot system including a robot and a controller, and particularly relates to a method for stopping a robot if a power failure is detected and a robot system.

BACKGROUND ART

In a robot system including a robot (also referred to as a manipulator) and a controller, shafts of the robot are each driven by a motor. If the feed of electric power from an external power source to the robot system is interrupted, that is to say, a power failure occurs, the robot needs to be stopped. The stoppage of the robot upon a power failure is normally classified as an erroneous stoppage, so that a great deal of labor is required for the reboot of the robot after the restoration of the power source. If the robot is urgently stopped by immediately actuating an electromagnetic brake upon detection of a power failure, an abrupt braking by the electromagnetic brake may affect an arm or a reduction gear in the robot or even an object worked or conveyed by the robot. Consequently, the robot is operated in a state of being controllable even if a power failure occurs, so as to stop the robot safely. It should be noted that a power failure continuing for one second or longer occurs with relatively low frequency and most power failures are each a power failure or voltage drop continuing for a very short time, several hundred milliseconds for instance, called an instantaneous interruption, an instantaneous disconnection or a momentary power failure.

For the purpose of preventing an abrupt stoppage of a robot when a power failure is detected, Patent Literature 1 discloses that a first electromagnetic brake and a second electromagnetic brake weaker in braking force than the first electromagnetic brake are provided and the second electromagnetic brake is precedently operated if the occurrence of a power failure is detected. Patent Literature 2 discloses that a large capacitance capacitor is provided so as to feed electric power even to a main circuit power source of a robot upon a power failure, and an arm of the robot is stopped with a large coasting angle if the occurrence of a power failure is detected. Patent Literature 3 discloses that, in order to continue operation of a robot according to the time, for which a reduction in voltage of a power source or a power failure continues, speed restriction information corresponding to a power source abnormality continuation time that is time elapsing from the detection of an abnormality such as a power failure is stored in a table and, if a power failure is detected, shafts of the robot are restricted in speed based on the speed restriction information. In such technology, the speed after restriction is 0% on the speed under energization and the robot is stopped if the power source abnormality continuation time exceeds a specified time. Patent Literature 4 discloses that a battery is mounted on a mobile robot that is operated by an external power source, and the robot is operated by the battery upon a power failure in the external power source so as to continue a work.

CITATION LIST

Patent Literature

[Patent Literature 1] Japanese Unexamined Patent Application Publication No. 2009-95939
[Patent Literature 2] Japanese Unexamined Patent Application Publication No. 2002-218676
[Patent Literature 3] Japanese Unexamined Patent Application Publication No. 2004-220384
[Patent Literature 4] Japanese Unexamined Patent Application Publication No. 2001-339875

SUMMARY OF THE INVENTION

Problems to be Solved by the Invention

The technologies as described in Patent Literatures 1 through 4 each disclosing an operation of a robot upon detection of a power failure in an external power source are to use electric energy accumulated in a capacitor or a battery to cause the robot or a controller to perform some operation if the feed of electric power from the external power source is interrupted. The technologies as described in Patent Literatures 3 and 4, in particular, are aimed at allowing a robot to readily perform a normal operation after the restoration from an instantaneous interruption. The capacitor and the battery are commonly to be provided in the controller, and downsizing of the controller decreases the capacitance of a capacitor or battery that can be housed in the controller, leading to the restriction of the operation, which the robot is caused to perform if a power failure is detected. As a result, it is difficult to cause the robot to return to a normal operation immediately after the restoration of the power source from an instantaneous interruption or an instantaneous disconnection.

An object of the present invention is to provide a method for stopping a robot provided with a capacitor or a battery as a standby power source for causing the robot to perform a specified operation if a power failure in an external power source is detected, the method making it possible to reduce power consumption on the standby power source and facilitating the reboot upon restoration of the power source and the restart of a normal operation, and a robot system for fulfilling such a stopping method.

Means for Solving the Problem

A method for stopping a robot according to the present invention is a method for stopping a robot having a plurality of shafts if occurrence of a power failure in an external power source is detected, the method including: setting a shaft in the robot that moves at least part of the robot in a gravity direction as a Z shaft, and setting a time, at which the occurrence of the power failure has been detected, as a reference time; and performing a first control if the occurrence of the power failure has been detected when the Z shaft is in a state of ascent, in which, based on an ascending speed of the Z shaft at the reference time, a time until a speed of the Z shaft reaches zero as a result of deceleration by a gravitational acceleration is calculated as a deceleration time, and the Z shaft is driven so as to decelerate and stop ascent of the Z shaft by spending the deceleration time.

According to the method for stopping a robot of the present invention, the Z shaft of the robot is decelerated by the gravitational acceleration upon detection of the occurrence of a power failure, so that electric power consumed by a motor for driving the Z shaft is made low, and, if a power failure occurs, the Z shaft of the robot is safely stopped while reducing the consumption of electric power from a standby power source.

In the method for stopping a robot of the present invention, it is preferable that a position of the Z shaft at the reference time is set as a reference position, and a second control is started when the deceleration time has elapsed from the reference time, in which control the Z shaft is driven so as to move the Z shaft to the reference position by spending time identical to the deceleration time. In the second control, the Z shaft moves following a locus of free fall and the power consumption for the period of the second control is thus reduced. The power consumption is reduced throughout the first control and the second control, so that the time, for which the restoration of the power source can be waited in order to return to a normal operation, is made longer.

If the second control is to be performed, the second control may be brought to an end if restoration from the power failure is detected after the deceleration time elapses from the reference time. Such configuration makes it possible to quickly cause the robot to return to the normal operation. Alternatively, if the second control is to be performed, a third control may be performed after the Z shaft is moved to the reference position by the second control, in which third control the Z shaft is driven so as to decelerate and stop the Z shaft by spending the time identical to the deceleration time. Such configuration makes it possible to safely decelerate, stop, and hold the Z shaft without increasing the power consumption even if the power failure lasts for a long time.

In the method for stopping a robot of the present invention, the Z shaft of the robot may be constituted of a two-stage ascent and descent mechanism including a first ascent and descent mechanism and a second ascent and descent mechanism. In that case, a control amount for the Z shaft is preferably distributed to the first ascent and descent mechanism and the second ascent and descent mechanism at a specified ratio. As a result of the distribution at a specified ratio, the Z shaft is decelerated and stopped while restraining the power consumption, and the calculation of control amounts for the individual ascent and descent mechanisms is simplified so as to reduce an arithmetic load. If the Z shaft is constituted of the two-stage ascent and descent mechanism and the first ascent and descent mechanism is arranged closer to a base of the robot than the second ascent and descent mechanism is, it is also possible that, if the occurrence of the power failure has been detected, the first ascent and descent mechanism is set as the Z shaft and the first control and the second control are performed, then a time, at which the second control on the first ascent and descent mechanism has ended, is set as the reference time and the first control and the second control are performed on the second ascent and descent mechanism. Performing the controls on the first ascent and descent mechanism and the second ascent and descent mechanism at different times makes it possible to decelerate and stop the Z shaft while restraining the power consumption even if the mass of the ascent and descent mechanisms cannot be disregarded.

In the method for stopping a robot of the present invention, it is preferable that an open phase in the external power source is detected so as to detect the occurrence of the power failure. The occurrence of the power failure is detected by detecting the open phase, which allows an early detection of the occurrence of the power failure.

A robot system according to the present invention is a robot system including a robot having a plurality of shafts, and a controller that is fed with electric power from an external power source so as to drive and control the robot, the robot being provided with a Z shaft that moves at least part of the robot in a gravity direction, the robot system including: a power failure detection means configured to detect occurrence of a power failure in the external power source; and a control means provided on the controller and configured to set a time, at which the occurrence of the power failure has been detected, as a reference time and perform a first control if the occurrence of the power failure has been detected by the power failure detection means when the Z shaft is in a state of ascent, in which control time until a speed of the Z shaft reaches zero as a result of deceleration by a gravitational acceleration is calculated as a deceleration time, based on an ascending speed of the Z shaft at the reference time, and the Z shaft is driven so as to decelerate and stop ascent of the Z shaft by spending the deceleration time.

According to the robot system of the present invention, the Z shaft of the robot is decelerated by the gravitational acceleration upon detection of the occurrence of a power failure, so that electric power consumed by a motor for driving the Z shaft is made low, and, if a power failure occurs, the Z shaft of the robot is safely stopped while reducing the consumption of electric power from a standby power source.

In the robot system of the present invention, it is preferable that a position of the Z shaft at the reference time is set as a reference position, and the control means starts a second control when the deceleration time has elapsed from the reference time, in which control the Z shaft is driven so as to move the Z shaft to the reference position by spending time identical to the deceleration time. In the second control, the Z shaft moves following a locus of free fall and the power consumption for the period of the second control is thus reduced. The power consumption is reduced throughout the first control and the second control, so that the time, for which the restoration of the power source can be waited in order to return to a normal operation, is made longer.

If the second control is to be performed, the control means may bring the second control to an end if restoration from the power failure is detected after the deceleration time elapses from the reference time. Bringing the second control to an end makes it possible to quickly cause the robot to return to the normal operation. Alternatively, the control means may perform a third control after the Z shaft is moved to the reference position by the second control, in which third control the Z shaft is driven so as to decelerate and stop the Z shaft by spending the time identical to the deceleration time. Performing the third control makes it possible to safely decelerate, stop, and hold the Z shaft without increasing the power consumption even if the power failure lasts for a long time.

In the present invention, the robot may be provided, as the Z shaft, with a two-stage ascent and descent mechanism including a first ascent and descent mechanism and a second ascent and descent mechanism. If the robot is provided with the two-stage ascent and descent mechanism, it is preferable that the control means outputs a control amount calculated with respect to the Z shaft so as to distribute the control amount to the first ascent and descent mechanism and the second ascent and descent mechanism at a specified ratio. As a result of the distribution at a specified ratio, the Z shaft is decelerated and stopped while restraining the power consumption, and the calculation of control amounts for the individual ascent and descent mechanisms is simplified so as to reduce an arithmetic load. If the Z shaft of the robot is constituted of the two-stage ascent and descent mechanism and the first ascent and descent mechanism is arranged closer to a base of the robot than the second ascent and descent mechanism is, it is also possible that, if the occurrence of the power failure has been detected, the control means sets the first ascent and descent mechanism as the Z shaft and performs the first control and the second control, then sets a time, at which the second control on the first ascent and descent mechanism has ended, as the reference time and performs the first control and the second control on the second ascent and descent mechanism. Performing the controls on the first ascent and descent mechanism and the second ascent and descent mechanism at different times makes it possible to decelerate and stop the Z shaft while restraining the power consumption even if the mass of the ascent and descent mechanisms cannot be disregarded.

In the robot system of the present invention, the power failure detection means preferably includes an open phase detector that detects an open phase in the external power source. The use of the open phase detector allows an early detection of the occurrence of the power failure.

Effect of the Invention

According to the present invention, the Z shaft of the robot is decelerated by the gravitational acceleration upon detection of the occurrence of a power failure, so that electric power consumed by a motor for driving the Z shaft is made low, and, if a power failure occurs, the Z shaft of the robot is safely stopped while reducing the consumption of electric power from a standby power source.

DESCRIPTION OF EMBODIMENTS

Figure 1:
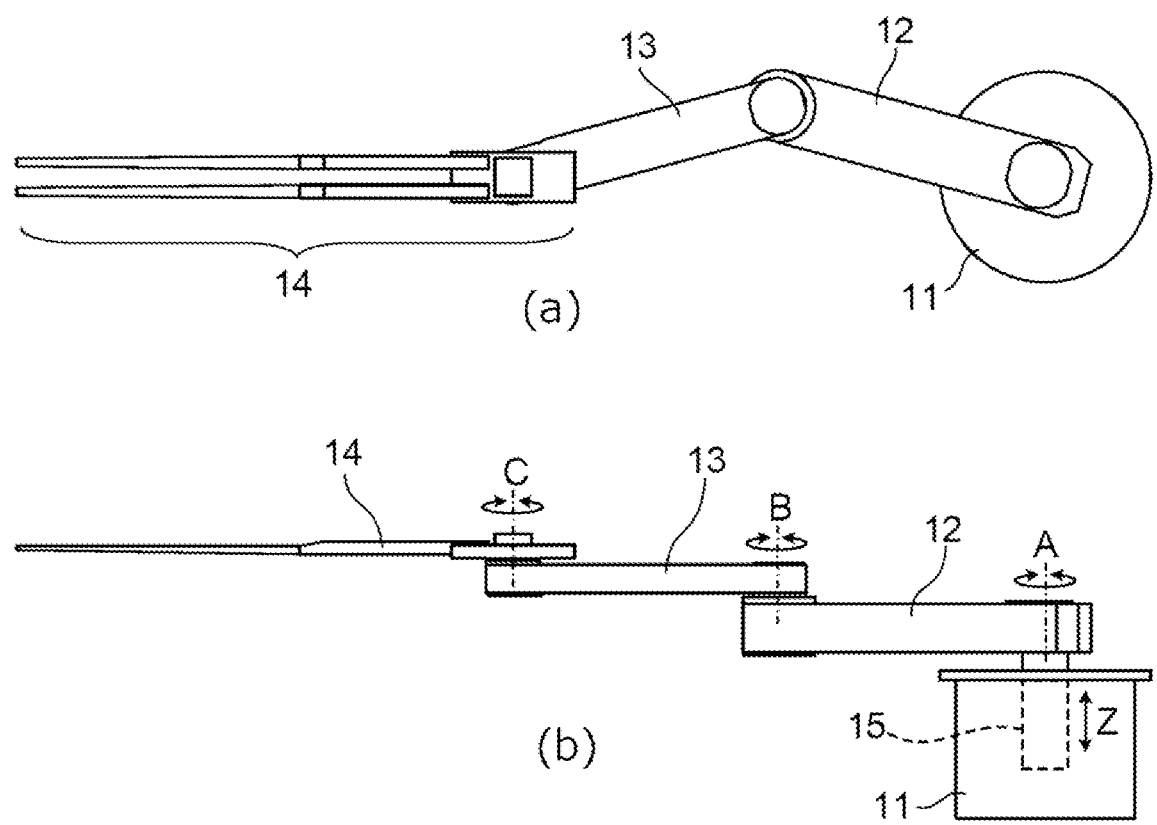
FIG. 1 is a diagram of which (a) and (b) are a plan view and a front view illustrating a robot, respectively.

Next, embodiments of the present invention are described with reference to the drawings. FIG. 1 is a diagram illustrating an exemplary configuration of a robot included in a robot system according to an embodiment of the present invention, of which (a) is a plan view and (b) is a front view. The robot illustrated in FIG. 1 is a selective compliance assembly robot arm robot used for the conveyance of a semiconductor substrate, a glass substrate, and the like, and includes a base 11, a first arm 12 fitted on the base 11, a second arm 13 fitted at a tip of the first arm 12, and a hand 14 fitted at a tip of the second arm 13. The hand 14 is to hold an object to be conveyed such as a glass substrate, and is formed in a fork shape. The first arm 12 is rotatable round a shaft A with respect to the base 11, the second arm 13 is rotatable round a shaft B with respect to the first arm 12, and the hand 14 is rotatable round a shaft C with respect to the second arm 13. In order to allow rotations round the shafts A, B, and C as joint shafts of the robot, the robot is provided with a motor (not illustrated in FIG. 1) for each shaft.

The robot is further provided with an ascent and descent mechanism 15 that is mounted on the base 11 and causes the first arm 12 to ascend and descend in a Z direction in the figure, and the ascent and descent mechanism 15 is driven by a motor for ascent and descent (not illustrated in FIG. 1). The Z direction is so defined as to coincide with a gravity direction on the robot and, in this regard, a motion of the robot that is caused by the ascent and descent mechanism 15 is referred to as a motion through a Z shaft and the motor for ascent and descent is referred to as a motor for the Z shaft. The shafts A, B, and C are each parallel to the Z direction and the rotations of the arms 12 and 13 as well as the hand 14 round the shafts A, B, and C do not resist gravity, so that the motors fitted on the shafts A, B, and C are driven with a relatively low electric power. In contrast, the motor for the Z shaft is to vertically move parts from the first arm 12 to the hand 14 of the robot as a whole through the ascent and descent mechanism 15 and, consequently, consumes a high electric power particularly when the ascent and descent mechanism 15 moves in a direction of ascent.

Figure 2:
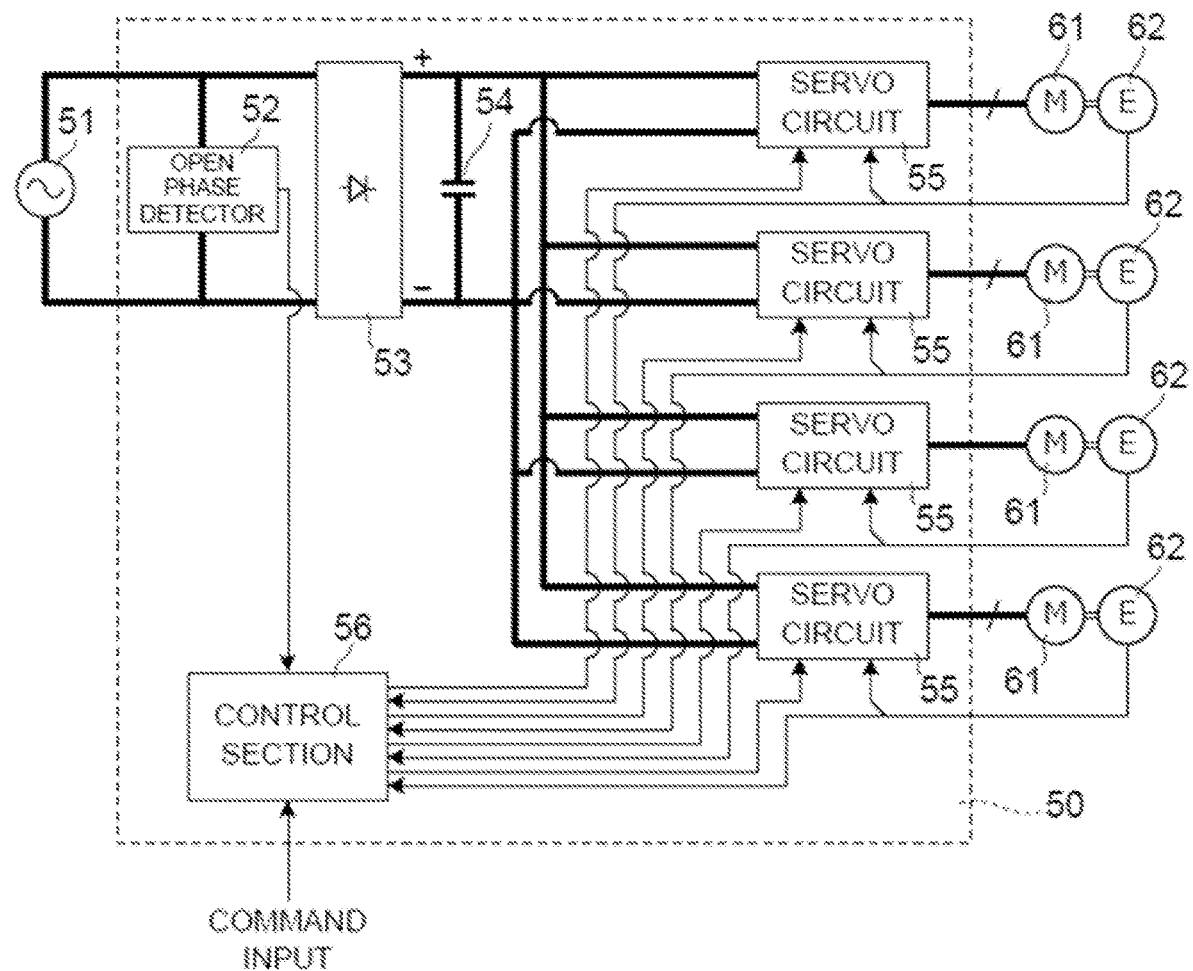
FIG. 2 is a block diagram illustrating a robot system according to an embodiment of the present invention.

FIG. 2 is a block diagram illustrating a circuit structure of a robot system including the robot illustrated in FIG. 1 and a controller 50 that is connected to the robot so as to control the robot. In FIG. 2, wiring of an electric power system is illustrated with thick lines. In the robot, to each of motors 61 for the respective shafts, an encoder 62 that detects a rotational position of the relevant motor 61 and outputs a position detection signal is mechanically coupled. The motors 61 are each a three-phase brushless three-phase synchronous motor, for instance. In the figure, four motors 61 are illustrated and the motors 61 correspond to the shafts A, B, C, and Z, respectively. As a matter of course, the number of shafts of the robot is not limited to four and the number of the motors 61 is not limited to four either.

The controller 50 is fed with an alternating current power from a commercial alternating current power source 51 as an external power source so as to drive the motors 61, and includes an open phase detector 52 that detects an open phase in the alternating current power from the commercial alternating current power source 51, a rectifier circuit 53 that converts the fed alternating current power to a direct current power, a capacitor 54 provided on the output side of the rectifier circuit 53, servo circuits 55 provided correspondingly to the motors 61, and a control section 56 that a command fed from outside for the control of the robot is input to and that drives and controls the motors 61 for the respective shafts through the servo circuits 55. The open phase detector 52 is provided in order to detect a power failure in the commercial alternating current power source 51 and outputs a power failure detection signal to the control section 56 if detecting the open phase. The capacitor 54 serves as a smoothing capacitor on the direct current power output by the rectifier circuit 53 and, at the same time, has a function to feed the direct current power to the servo circuits 55 if a power failure occurs in the commercial alternating current power source 51. In the present embodiment, any means other than the open phase detector 52 can be used as long as the means is capable of detecting a power failure in the commercial alternating current power source 51, while it is preferable for an earlier detection of the occurrence of a power failure to use the open phase detector 52. It is possible indeed to detect a power failure based on the reduction in output voltage of the rectifier circuit 53, but, in that case, a delay time from the occurrence of a power failure to the detection of the power failure is long due to the capacitor 54 connected to an output of the rectifier circuit 53, so that it is undesirable to detect a power failure based on the reduction in output voltage of the rectifier circuit 53.

The servo circuits 55, which are provided for the motors 61, respectively, are each of a known configuration, and each servo circuit 55 is fed with the direct current power from the rectifier circuit 53 so as to control the motor 61 as a driving target by servo control, based on the position detection signal from the encoder 62 coupled to the targeted motor 61 and a speed command from the control section 56. The control section 56 generates, and outputs to the respective servo circuits 55, speed commands for driving the motors 61 for the respective shafts based on commands input from outside and the position detection signals from the encoders 62 coupled to the motors 61 for the respective shafts. In the present embodiment, a process for generating speed commands for driving the respective motors 61 according to the commands from outside is equal to a common process normally performed in order to control a robot. The control section 56 further performs a process for stopping the robot safely and so that the robot may be ready to reboot, if the power failure detection signal is input from the open phase detector 52.

Next, description is made on a process performed if a power failure occurs in the commercial alternating current power source 51 in the robot system. It is assumed that a power failure has occurred when the robot is operating. Among the shafts of the robot, the shafts A, B, and C are shafts that are to horizontally move the arms 12 and 13 as well as the hand 14, do not require a high electric power for operation, and that escape a danger of falling due to the interruption of power feed or the like. Therefore, the control section 56 performs such control as normally performed upon detection of a power failure on the motors 61 for the shafts A, B, and C so as to stop the shafts A, B, and C by spending a deceleration time specified in advance as provision for power failures. If the robot is moving with respect to the Z shaft and the motion in question is a descending motion, the electric power, which is consumed by the motor 61 for the Z shaft, is low, so that the control section 56 controls the motor 61 for the Z shaft so as to stop the Z shaft by spending a deceleration time specified in advance as provision for power failures. If the robot is moving so as to ascend with respect to the Z shaft, such motion is a motion resisting gravity and the motor 61 for the Z shaft consumes a high electric power. In the present embodiment, if the occurrence of a power failure has been detected when the robot is in a state of ascending with respect to the Z shaft, control allowing the Z shaft to be stopped with as low a power consumption as possible while continuing to control the robot is performed. At that time, taking account of the possibility that the power failure is an instantaneous interruption with a duration of 200 milliseconds or shorter, for instance, control allowing as early a return to a normal operation as possible is performed in the case of an instantaneous interruption. The control to be performed if a power failure has been detected during the ascent with respect to the Z shaft is detailed below.

Figure 3:
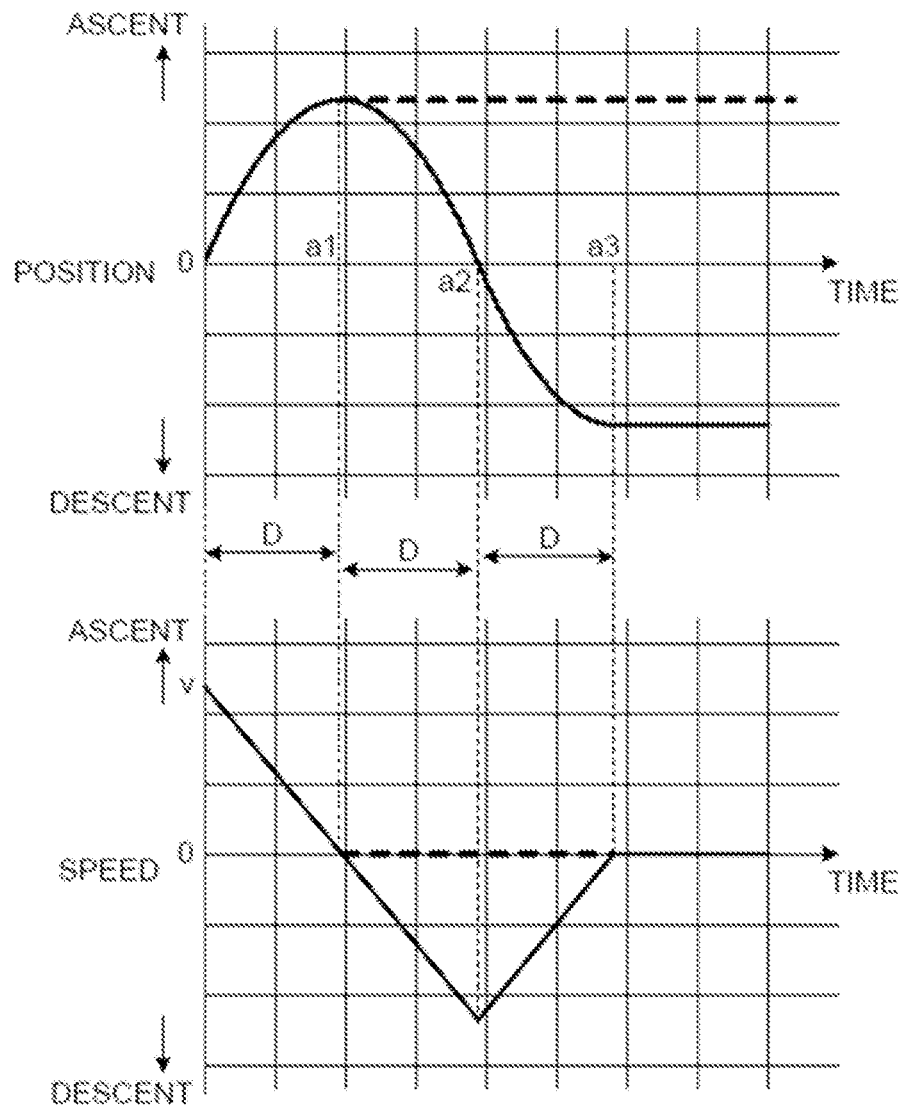
FIG. 3 is a graph illustrating change in position and speed of the robot caused by a motion in a Z direction.

FIG. 3 is a graph for explaining the control to be performed if a power failure has been detected during the ascent with respect to the Z shaft, and illustrates the change over time in position and speed in the Z direction of the robot. The time, at which the power failure has been detected, is set as a reference time in the control and expressed as a time 0, and the position in the Z direction, which was occupied when the power failure has been detected, is set as a reference position and expressed as a position 0. The position in the Z direction can specifically be expressed by the height of the hand 14 of the robot in the present embodiment as a selective compliance assembly robot arm robot.

If the open phase detector 52 detects an open phase in the commercial alternating current power source 51 and outputs the power failure detection signal, the control section 56 initially determines whether the Z shaft of the robot is moving in the direction of ascent. If the Z shaft is moving in the direction of ascent, the control section 56 acquires an ascending speed v at that time and calculates, based on the acquired ascending speed v, time until the speed of an ascending motion through the Z shaft reaches zero as a result of deceleration by a gravitational acceleration. The calculated time is referred to as a deceleration time D. Then, the control section 56 outputs, to the servo circuit 55 for the Z shaft, a speed command for driving the motor 61 for the Z shaft so that the motion of the Z shaft may stop by spending the calculated deceleration time D. Such control is referred to as a first control. Based on the speed command, the servo circuit 55 is operated by electric power stored in the capacitor 54 and decelerates and stops the motor 61 for the Z shaft. At this time, the Z shaft of the robot is essentially fed with no energy from outside but moves by inertia so as to decelerate and stop, so that the power consumption for driving the motor 61 so that the motor 61 may decelerate and stop is reduced. As a result, the electric power stored in the capacitor 54 is less consumed during the power failure.

If the first control as above is performed, the speed in the Z direction of the robot is reduced by the gravitational acceleration, and the speed in the Z direction reaches zero and the position in the Z direction is at the highest point at a time a1 when the deceleration time D has elapsed from the detection of the power failure, as illustrated in FIG. 3. After that, in the present embodiment, the control section 56 performs control to drive the motor 61 for the Z shaft in a direction of falling against gravity during the same time as the deceleration time D. Such control is referred to as a second control. In the second control, the Z shaft of the robot moves nearly in a state of free fall, so that the electric current consumed by the motor 61 is deemed to be low. As a result of such motion, the position of the Z shaft of the robot returns to the position, which was occupied when the power failure has initially been detected, namely the reference position, at a time a2 when time two times as long as the deceleration time D, namely time 2D, has elapsed from the detection of the power failure. After all, the Z shaft of the robot is so controlled for a period from the time 0, at which the power failure has been detected, to the time a2 as to make a parabolic motion by the gravitational acceleration. If the first and second controls are to be performed and, in that case, if the power failure is an instantaneous interruption and the commercial alternating current power source 51 is restored from the power failure within the time 2D of the occurrence of the power failure, the robot is able to immediately transfer to control for the normal operation. The restoration of the power source from the instantaneous interruption can be waited up to a maximum of the time 2D, which is two times as long as the deceleration time D, so that control to completely stop the robot in order to cope with a power failure lasting for a long time is performed less frequently and the operating rate of the robot is improved.

If the power source was not restored by the time a2, the control section 56 controls the motor 61 so that the Z shaft of the robot, which is descending nearly in the state of free fall, may be decelerated and stopped. Such control is referred to as a third control. The time, in which the motor 61 is to be stopped, can appropriately be specified based on the configuration of the robot, the object to be conveyed or the like, and the deceleration time D, which is found by calculation beforehand, can be used as an example. In the present embodiment, the Z shaft moves in accordance with the gravitational acceleration during the period from the time 0 to the time a2, which does not mean that no control is performed during the period, but a feedback control insistently based on the position detection signal from the encoder 62 is performed for a secure operation of the robot. In such feedback control, speed commands are already calculated every moment and, by using the deceleration time D found beforehand as the deceleration time, in which the Z shaft is decelerated and stopped after the time a2, a series of speed commands already calculated can be inverted with respect to the time and the positive and negative signs and as such used as a series of speed commands during the deceleration and stoppage. Consequently, an arithmetic load is reduced when the Z shaft is decelerated and stopped after the time a2. As a result of the control of deceleration and stoppage of the Z shaft, the Z shaft stops at a time a3. Such control of deceleration and stoppage makes it possible to stop the Z shaft safely while restraining the power consumption as a whole because the power consumption of the motor 61 for the Z shaft during the period from the occurrence of the power failure to the time a2, that is to say, during the first and second controls is deemed to be low.

In the present embodiment, if a power failure has occurred when the Z shaft of the robot is ascending, the first control is performed, in which time until the speed of the Z shaft reaches zero as a result of deceleration by the gravitational acceleration is calculated from the ascending speed at the time of the occurrence of the power failure as the deceleration time D and the Z shaft is decelerated and stopped by spending the deceleration time D, so as to stop the Z shaft while restraining the power consumption even during the instantaneous interruption, then the second control is performed, in which the Z shaft is so controlled as to fall by spending the deceleration time D, so as to cope even with the case, where the time until the restoration of the power source is long, and, subsequently, the third control is performed, in which the Z shaft is decelerated and stopped by spending the deceleration time D, so as to hold the Z shaft safely even if the power failure continues, while restraining the power consumption as a whole.

In the embodiment as described above, the Z shaft may be made to stand still so as to stop the robot when the speed of the Z shaft reaches zero at the time a1, as illustrated with a broken line in FIG. 3. In other words, the first control may only be performed so as to decelerate and stop the Z shaft and hold the Z shaft stopped. If the power source has been restored within the period from the occurrence of the power failure to the time a1, the first control may be performed until the time a1 so as to cause the speed of the Z shaft to reach zero at the time a1 and, while maintaining such state, control to transfer the robot to the normal operation may be started. If the commercial alternating current power source 51 has been restored between the time a1 and the time a2, control of the motion of the Z shaft according to the gravitational acceleration, namely the second control, may be brought to an end at the time of the restoration so as to start the control to transfer the robot to the normal operation, or the second and third controls may be performed until the time a3 so as to completely stop the motion in the Z direction and then start the control to transfer the robot to the normal operation.

Figure 4:
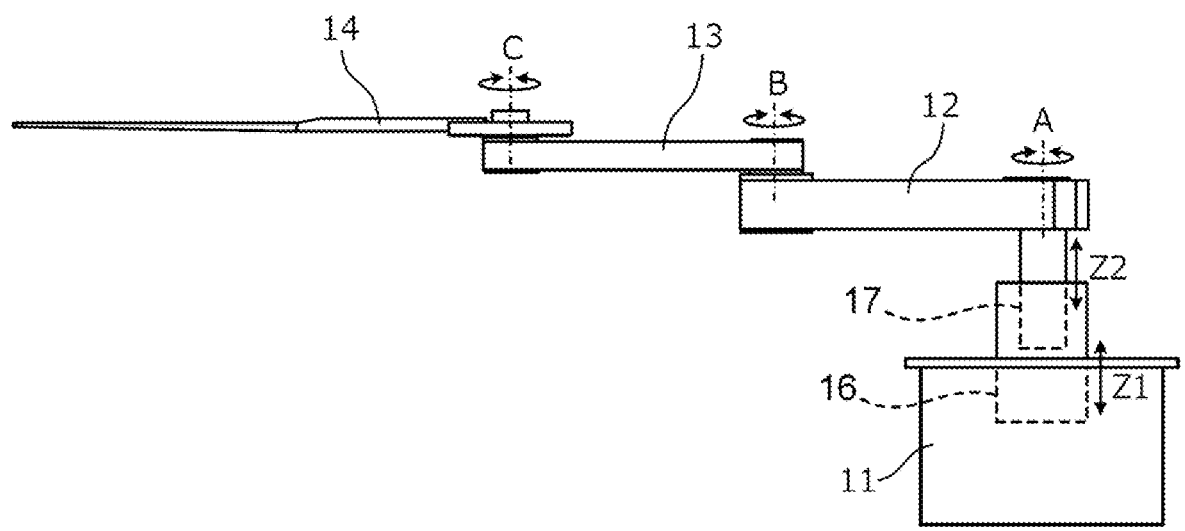
FIG. 4 is a front view illustrating a robot in another embodiment of the present invention.

In the above description, the Z shaft of the robot has a single-stage configuration, while a robot provided with a Z shaft having a two-stage configuration in order to increase an amount of mobility in the Z direction of the robot is also present. FIG. 4 illustrates a robot used in a robot system according to another embodiment of the present invention, and the robot is provided with a Z shaft having a two-stage configuration.

The robot illustrated in FIG. 4 is similar to the selective compliance assembly robot arm robot illustrated in FIG. 1 but different from the robot in FIG. 1 in that a first ascent and descent mechanism 16 is mounted on the base 11, a second ascent and descent mechanism 17 is fitted onto the first ascent and descent mechanism 16, and the first arm 12 is fitted onto the second ascent and descent mechanism 17. The first ascent and descent mechanism 16 causes parts from the second ascent and descent mechanism 17 to the hand 14 of the robot to ascend and descend, and the second ascent and descent mechanism 17 causes parts from the first arm 12 to the hand 14 of the robot to ascend and descend. The first ascent and descent mechanism 16 is referred to as a Z1 shaft and the second ascent and descent mechanism 17 is referred to as a Z2 shaft. The second ascent and descent mechanism 17 is included in the parts caused by the first ascent and descent mechanism 16 to ascend and descend, so that the position of the hand 14 is found by adding an amount of ascent/descent by the first ascent and descent mechanism 16 to an amount of ascent/descent by the second ascent and descent mechanism 17. Motors 61 are provided for the ascent and descent mechanisms 16 and 17, respectively, and the motors 61 are driven by the controller 50 so as to operate the ascent and descent mechanisms 16 and 17 independently.

Figure 5:
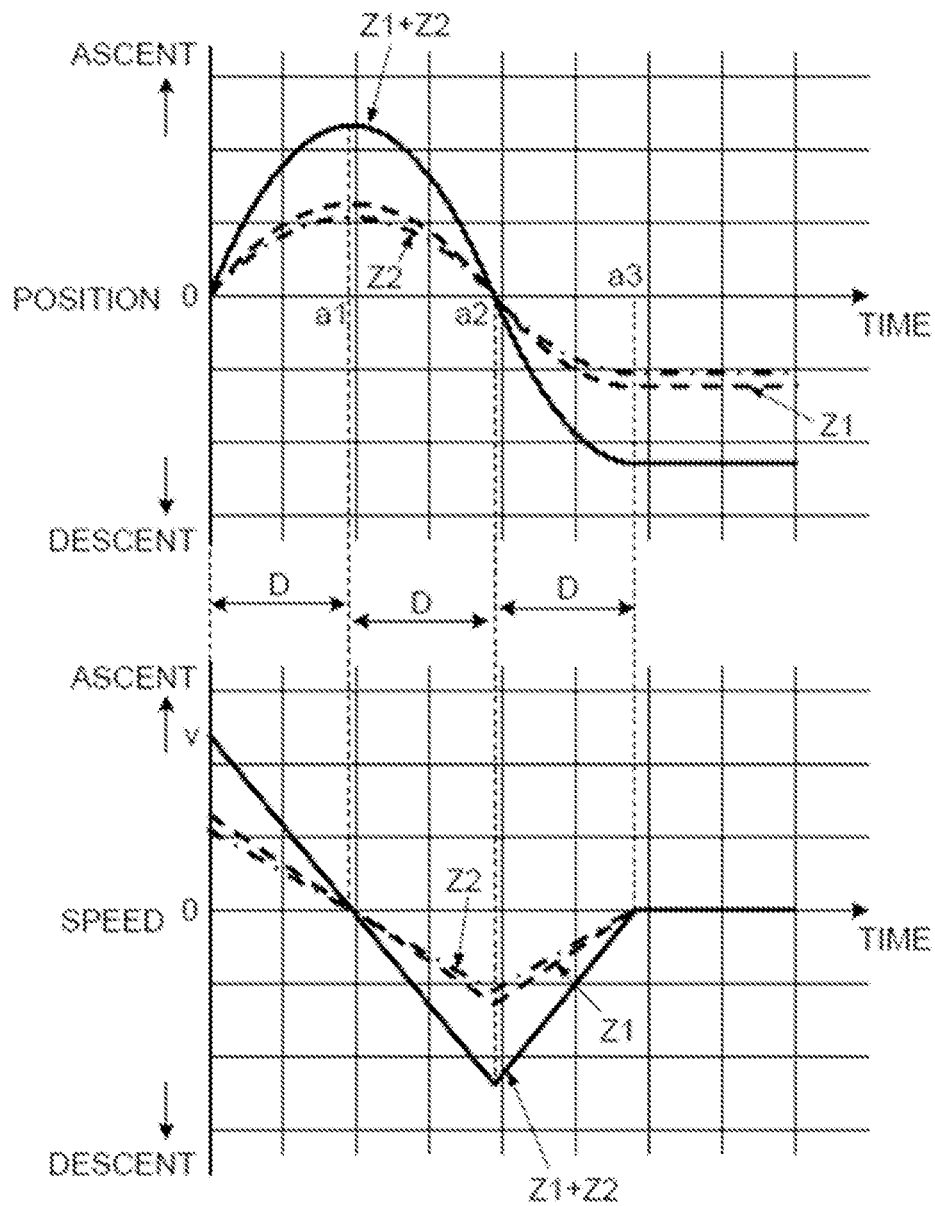
FIG. 5 is a graph illustrating change in position and speed of the robot caused by a motion in the Z direction.

In the robot illustrated in FIG. 4, similarly to the above case, the control section 56 controls the Z1 shaft and the Z2 shaft so that the power consumption may be reduced as a whole, if a power failure in the commercial alternating current power source 51 has been detected when the Z1 shaft and the Z2 shaft are ascending as a whole. FIG. 5 is a graph for explaining the control to be performed if a power failure has been detected when the Z1 shaft and the Z2 shaft are ascending as a whole, and illustrates the change over time in position and speed in the Z direction of the robot for each of the Z1 shaft and the Z2 shaft. The change with respect to the Z1 shaft is illustrated with broken lines, and the change with respect to the Z2 shaft is illustrated with chain lines. With respect to the Z2 shaft, values are those obtained from the Z2 shaft alone, to be specific, values of the amount of ascent/descent and the ascending/descending speed realized on the second ascent and descent mechanism 17 alone. In the figure, solid lines labelled as "Z1+Z2" indicate a composite of motions of the Z1 shaft and the Z2 shaft, namely, a motion in the Z direction of the hand 14.

In the control illustrated in FIG. 5, control amounts, namely speed command values, in the controls described using FIG. 3 are distributed to the Z1 shaft and the Z2 shaft at a specified ratio. In this case, neither the first ascent and descent mechanism 16 nor the second ascent and descent mechanism 17 makes in itself a motion corresponding to a motion of deceleration or fall according to the gravitational acceleration indeed, but parts in the robot on the tip side of the second ascent and descent mechanism 17 make the motion of deceleration or fall according to the gravitational acceleration, so that, if contribution of the mass of the ascent and descent mechanisms 16 and 17 themselves is disregarded, the electric power consumed by the respective motors 61 for the ascent and descent mechanisms 16 and 17 is reduced as a whole. In this control, the speed command values, which are generated in the control as described using FIG. 3, are distributed to the Z1 shaft and the Z2 shaft at a specified ratio, so that a process for calculating speed command values for each of the Z1 shaft and the Z2 shaft is simplified and an arithmetic load on the control section 56 is reduced.

Figure 6:
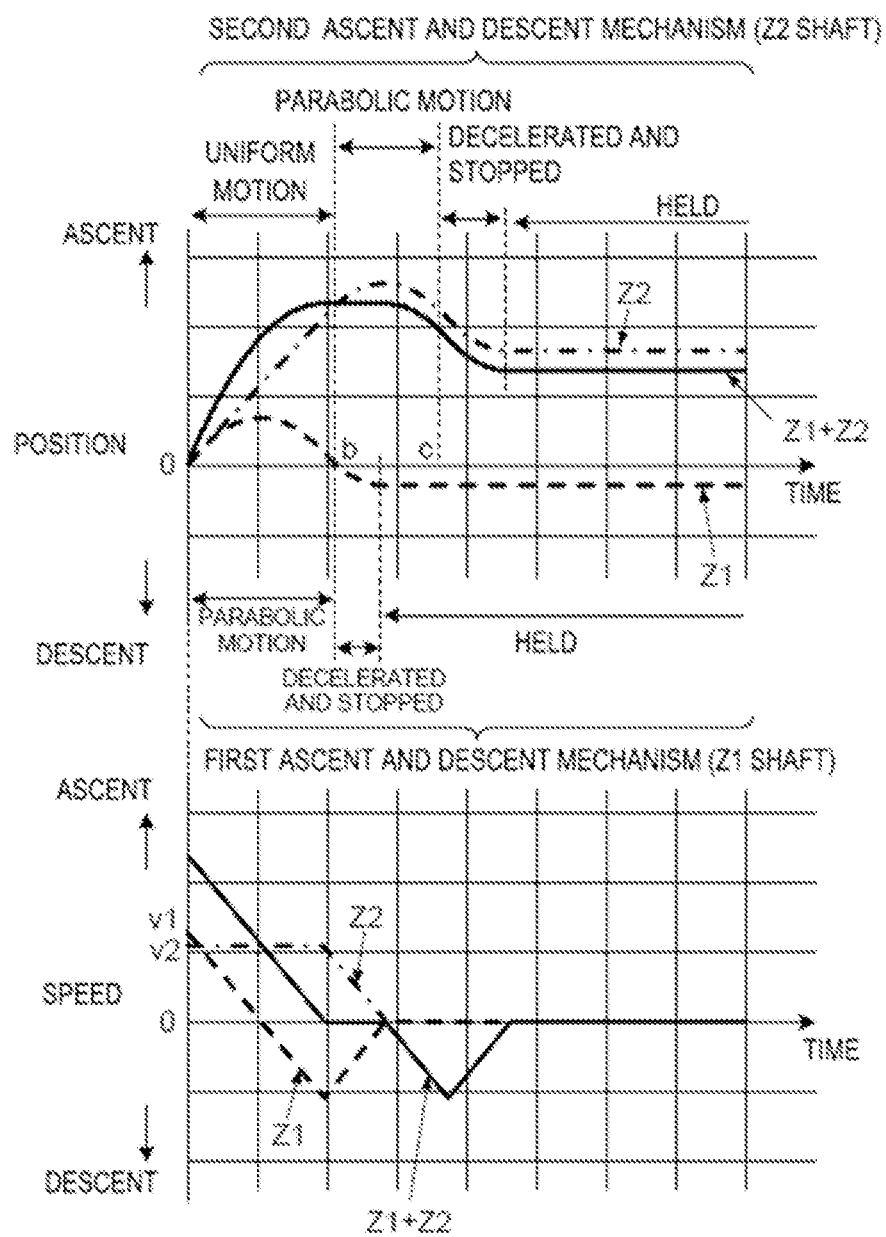
FIG. 6 is a graph illustrating change in position and speed of the robot caused by a motion in the Z direction.

FIG. 6 is, similarly to FIG. 5, a graph illustrating the change over time in position and speed in the Z direction of the robot for each of the Z1 shaft and the Z2 shaft, and illustrates another example of the control to be performed if the ascent and descent mechanisms 16 and 17 in the two-stage configuration are provided. In the control illustrated in FIG. 6, control allowing a motion according to the gravitational acceleration is initially performed on the first ascent and descent mechanism 16 closer to the base 11, then the control allowing a motion according to the gravitational acceleration is performed on the second ascent and descent mechanism 17 farther from the base 11. The control is detailed below based on FIG. 6. If the occurrence of a power failure is detected at the time 0, the control section 56 calculates a deceleration time D1 of the deceleration by the gravitational acceleration based on a speed v1 of the Z1 shaft at the time of the detection, and performs, for the Z1 shaft, control allowing a parabolic motion (the first and second controls) similarly to the case illustrated in FIG. 3. At a time b when time two times as long as the deceleration time D1 has elapsed, the parabolic motion of the Z1 shaft ends, then the control section 56 performs control to decelerate and stop the Z1 shaft (the third control). During a period between the time 0 and the time b, the control section 56 performs, for the Z2 shaft, control to maintain the speed at the time of the occurrence of the power failure, namely, control to maintain a uniform motion with respect to the Z1 shaft. After the time b, the control section 56 calculates, for the Z2 shaft, a deceleration time D2 of the deceleration by the gravitational acceleration based on a speed v2 of the Z2 shaft at that time and performs the control allowing a parabolic motion (the first and second controls) similarly to the case illustrated in FIG. 3. At a time c when time two times as long as the deceleration time D2 has elapsed from the time b, the parabolic motion of the Z2 shaft ends, then the control section 56 performs control to decelerate and stop the Z2 shaft (the third control). The control illustrated in FIG. 6 makes it possible to stop the robot safely and so that the robot may be ready to restart, with a lower power consumption when the contribution of the mass of the ascent and descent mechanisms 16 and 17 cannot be disregarded.

The invention claimed is:

1. A method for stopping a robot having a plurality of shafts if occurrence of a power failure in an external power source is detected, the method comprising:

setting a shaft in the robot that moves at least part of the robot in a gravity direction as a Z shaft, and setting a time, at which the occurrence of the power failure has been detected, as a reference time; and performing a first control if the occurrence of the power failure has been detected when the Z shaft is in a state of ascent, in which based on an ascending speed of the Z shaft at the reference time, a time until a speed of the Z shaft reaches zero as a result of deceleration by a gravitational acceleration is calculated as a deceleration time, and the Z shaft is driven so as to decelerate and stop ascent of the Z shaft by spending the deceleration time.

2. The method for stopping the robot according to claim 1, wherein a position of the Z shaft at the reference time is set as a reference position, and a second control is started when the deceleration time has elapsed from the reference time, in which control of the Z shaft is driven so as to move the Z shaft to the reference position by spending time identical to the deceleration time.

3. The method for stopping the robot according to claim 2, wherein the second control is brought to an end if restoration from the power failure is detected after the deceleration time has elapsed from the reference time.

4. The method for stopping the robot according to claim 2, wherein, after the Z shaft is moved to the reference position by the second control, a third control is performed in which the Z shaft is driven so as to decelerate and stop the Z shaft by spending the time identical to the deceleration time.

5. The method for stopping the robot according to claim 2, wherein the Z shaft is constituted of a two-stage ascent and descent mechanism including a first ascent and descent mechanism and a second ascent and descent mechanism, the first ascent and descent mechanism being arranged closer to a base of the robot than the second ascent and descent mechanism, and wherein, if the occurrence of the power failure has been detected, the first ascent and descent mechanism is set as the Z shaft and the first control and the second control are performed, thereafter, a time at which the second control on the first ascent and descent mechanism has ended is set as the reference time, and then the first control and the second control are performed on the second ascent and descent mechanism.

6. The method for stopping the robot according to claim 1, wherein the Z shaft is constituted of a two-stage ascent and descent mechanism including a first ascent and descent mechanism and a second ascent and descent mechanism, and wherein a control amount for the Z shaft is distributed to the first ascent and descent mechanism and the second ascent and descent mechanism at a specified ratio.

7. The method for stopping the robot according to claim 1, wherein an open phase in the external power source is detected so as to detect the occurrence of the power failure.

8. A robot system including a robot having a plurality of shafts, and a controller that is fed with electric power from an external power source so as to drive and control the robot, the robot being provided with a Z shaft that moves at least part of the robot in a gravity direction, the robot system comprising:

a power failure detection means for detecting occurrence of a power failure in the external power source; and a control means provided on the controller for setting a time, at which the occurrence of the power failure has been detected, as a reference time and perform a first control if the occurrence of the power failure has been detected by the power failure detection means when the Z shaft is in a state of ascent, in which, based on an ascending speed of the Z shaft at the reference time, a time until a speed of the Z shaft reaches zero as a result of deceleration by a gravitational acceleration is calculated as a deceleration time, and the Z shaft is driven so as to decelerate and stop ascent of the Z shaft by spending the deceleration time.

9. The robot system according to claim 8, wherein a position of the Z shaft at the reference time is set as a reference position, and the control means starts a second control when the deceleration time has elapsed from the reference time, in which control of the Z shaft is driven so as to move the Z shaft to the reference position by spending time identical to the deceleration time.

10. The robot system according to claim 9, wherein the control means brings the second control to an end if restoration from the power failure is detected after the deceleration time has elapsed from the reference time.

11. The robot system according to claim 9, wherein, after the Z shaft is moved to the reference position by the second control, the control means performs a third control in which the Z shaft is driven so as to decelerate and stop the Z shaft by spending the time identical to the deceleration time.

12. The robot system according to claim 9,
wherein the robot is provided, as the Z shaft, with a two-stage ascent and descent mechanism including a first ascent and descent mechanism and a second ascent and descent mechanism, the first ascent and descent mechanism being arranged closer to a base of the robot than the second ascent and descent mechanism, and
wherein, if the occurrence of the power failure has been detected, the control means sets the first ascent and descent mechanism as the Z shaft and performs the first control and the second control, then sets a time, at which the second control on the first ascent and descent mechanism has ended as the reference time, and performs the first control and the second control on the second ascent and descent mechanism.

13. The robot system according to claim 8,
wherein the robot is provided, as the Z shaft, with a two-stage ascent and descent mechanism including a first ascent and descent mechanism and a second ascent and descent mechanism, and
wherein the control means outputs a control amount calculated with respect to the Z shaft so as to distribute the control amount to the first ascent and descent mechanism and the second ascent and descent mechanism at a specified ratio.

14. The robot system according to claim 8, wherein the power failure detection means includes an open phase detector that detects an open phase in the external power source.

* * * * *